United States Patent
Vermeulen et al.

(10) Patent No.: US 11,910,725 B2
(45) Date of Patent: Feb. 20, 2024

(54) MAGNETIC STRUCTURE FOR MAGNETIC DEVICE

(71) Applicants: IMEC vzw, Leuven (BE); Katholieke Universiteit Leuven, Leuven (BE)

(72) Inventors: Bart Vermeulen, Leuven (BE); Mihaela Ioana Popovici, Haasrode (BE); Koen Martens, Aalter (BE); Gouri Sankar Kar, Leuven (BE)

(73) Assignees: IMEC VZW, Leuven (BE); Katholieke Universiteit Leuven, Leuven (BE)

( * ) Notice: Subject to any disclaimer, the term of this patent is extended or adjusted under 35 U.S.C. 154(b) by 230 days.

(21) Appl. No.: 17/121,279

(22) Filed: Dec. 14, 2020

(65) Prior Publication Data
US 2021/0210678 A1    Jul. 8, 2021

(30) Foreign Application Priority Data

Dec. 18, 2019   (EP) .................................... 19217328

(51) Int. Cl.
*H10N 50/85*    (2023.01)
*H01F 10/32*    (2006.01)
(Continued)

(52) U.S. Cl.
CPC .......... *H10N 50/85* (2023.02); *H01F 10/3286* (2013.01); *H10B 61/00* (2023.02);
(Continued)

(58) Field of Classification Search
CPC ........ H10N 50/85; H10N 50/01; H10N 50/80; H10N 50/10; H01F 10/3286;
(Continued)

(56) References Cited

U.S. PATENT DOCUMENTS 9,502,087 B2    11/2016  Buhrman et al.
10,534,276 B1*  1/2020   Yang ................... G03F 7/70683
(Continued)

OTHER PUBLICATIONS

Wang et al. ("Perpendicular-anisotropy magnetic tunnel junction switched by spin-Hall-assisted spin0trasfer torque," J. Phys. D: Appl. Phys.48, 065001 "7pages", 2015) (Year: 2015).*
(Continued)

*Primary Examiner* — Yasser A Abdelaziez
(74) *Attorney, Agent, or Firm* — Knobbe, Martens, Olson & Bear, LLP (57) ABSTRACT

The present disclosure relates to magnetic devices. In particular, the disclosure relates to magnetic memory and logic devices that employ the voltage control of magnetic anisotropy (VCMA) effect for magnetization switching. The present disclosure provides a method for manufacturing a magnetic structure for such a magnetic device. The method comprising the following steps: providing a bottom electrode layer, forming a SrTiO₃ (STO) stack on the bottom electrode layer by atomic layer deposition (ALD) of at least two different STO nanolaminates, forming a magnetic layer
(Continued)

on the STO stack, and forming a perpendicular magnetic anisotropy (PMA) promoting layer on the magnetic layer, the PMA promoting layer being configured to promote PMA in the magnetic layer.

18 Claims, 7 Drawing Sheets

(51) Int. Cl.
  *H10B 61/00* (2023.01)
  *H10N 50/01* (2023.01)
  *H10N 50/10* (2023.01)
  *H10N 50/80* (2023.01)

(52) U.S. Cl.
  CPC ............ *H10N 50/01* (2023.02); *H10N 50/10* (2023.02); *H10N 50/80* (2023.02)

(58) Field of Classification Search
  CPC .. H01F 10/329; H01F 41/302; H01F 10/3236; H01F 10/3254; H10B 61/00
  See application file for complete search history.

(56) References Cited

U.S. PATENT DOCUMENTS

| | | | |
|---|---|---|---|
| 11,171,283 B2* | 11/2021 | Sun | H10B 61/00 |
| 2010/0072531 A1* | 3/2010 | Kittl | H10B 53/30 257/532 |
| 2011/0049659 A1 | 3/2011 | Suzuki et al. | |
| 2012/0092807 A1* | 4/2012 | Popovici | H01L 28/56 361/321.1 |
| 2013/0108877 A1* | 5/2013 | Blomberg | C30B 1/02 428/697 |
| 2014/0085968 A1* | 3/2014 | Saida | G11C 11/161 365/158 |
| 2016/0133307 A1 | 5/2016 | Lee et al. | |
| 2016/0148975 A1* | 5/2016 | Kato | H10N 50/10 428/828 |
| 2017/0301383 A1 | 10/2017 | Martens et al. | |

OTHER PUBLICATIONS

Amiri et al., Electric-Field-Controlled Magnetoelectric RAM: Progress, Challenges, and Scaling, IEEE Transactions on Magnetics, vol. 51, No. 11, Nov. 2015.

Anh et al., "Ultra-low-power orbital-controlled magnetization switching using a ferromagnetic oxide interface", Arxiv.Org, Cornell University Library, 201 Olin Library Cornell University Ithaca, NY 14853, Apr. 24, 2019.

Chien et al., "Enhanced voltage-controlled magnetic anisotropy in magnetic tunnel junctions with an Mg0/PZT/Mg0 tunnel barrier", Applied Physics Letters 108, 112402 (2016).

Duan et al., "Surface Magnetoelectric Effect in Ferromagnetic Metal Films", Physical Review Letters, PRL 101, 137201 (2008).

Kita et al., "Electric-field-control of magnetic anisotropy of $Co_{0.6}Fe_{0.2}B_{0.2}$/oxide stacks using reduced voltage", Journal of Applied Physics 112, 033919 (2012).

Nakazawa et al., "Electric field control of magnetic anisotropy in a Co/Pt bilayer deposited on a high-κ $SrTiO_3$", Applied Physics Letters 110, 062406 (2017).

Peng et al., "Large voltage-controlled magnetic anisotropy in the $SrTiO_3$/Fe/Cu structure", Applied Physics Letters, vol. 111, No. 15, p. 152403-1-152403-3, Oct. 9, 2017.

Popovici et al., "High-performance (EOT<0.4nm, $Jg\sim10^{-7}A/cm^2$) ALD-deposited Ru\$SrTiO_3$ stack for next generations DRAM pillar capacitor", pp. 2.7.1-2.7.4, © 2018 IEEE.

Popovici et al., "Low leakage stoichiometric $SrTiO_3$ dielectric for advanced metal-insulator-metal capacitors", Phys. Status Solidi RRL, 1-6 (2016) / DOI 10.1002/pssr.201600036.

Vermeulen et al., "Perpendicular magnetic anisotropy of Co\ Pt bilayers on ALD $HfO_2$", Journal of Applied Physics 120, 163903 (2016).

Zeng et al., "Novel Magnetic Tunneling Junction Memory Cell with Negative Capacitance-Amplified Voltage-Controlled Magnetic Anisotropy Effect", IEEE Transactions on Electron Devices, vol. 64, No. 12, Dec. 2017.

Extended European Search Report dated May 18, 2020 in counterpart European Application No. 19217328.4 in 9 pages.

* cited by examiner

MAGNETIC STRUCTURE FOR MAGNETIC DEVICE

CROSS-REFERENCE TO RELATED APPLICATIONS

This application claims foreign priority to European Patent Application No. EP 19217328.4, filed Dec. 18, 2019, the content of which is incorporated by reference herein in its entirety.

BACKGROUND

Field

The present disclosure relates generally to semiconductor devices, and more particularly to memory and logic devices comprising a magnetic structure.

Description of the Related Technology

Some magnetic memory or logic devices employ a magnetic tunnel junction (MTJ) stack. The MTJ stack typically comprises a magnetic free layer and a magnetic reference or fixed layer, which sandwich a tunnel barrier. Depending on the magnetization of the magnetic free layer, with respect to the fixed magnetization of the magnetic reference layer, a tunnel magnetoresistance (TMR) between the magnetic free layer and the magnetic reference layer can be larger or smaller. This can be used to distinguish between different (magnetic) states of the magnetic device, e.g. to store data.

SUMMARY OF CERTAIN INVENTIVE ASPECTS

To address various challenges associated with implementing magnetic memory or logic devices, a goal of the present disclosure is to improve the magnetic devices, and their productions methods. An objective is in particular to provide a magnetic structure for a magnetic device, which allows obtaining a stronger voltage control of magnetic anisotropy (VCMA) effect. Specifically, a complete suppression of the magnetic anisotropy by a strong VCMA effect is desired. The magnetic structure should be suitable for designing an MTJ stack for a magnetic device. Another aim is to provide specific magnetic device designs, which employ a strong VCMA effect. Thereby, an overall goal of the disclosure is to enable ultra-low-power, energy-efficient magnetic memory or logic devices.

The objective is achieved by the embodiments of the invention provided in the enclosed independent claims. Advantageous implementations of the embodiments of the invention are further defined in the dependent claims.

According to a first aspect, the disclosure relates to a method for manufacturing a magnetic structure for a magnetic device, the method comprising: providing a bottom electrode layer, forming a $SrTiO_3$, STO, stack on the bottom electrode layer by Atomic Layer Deposition (ALD) of at least two different STO nanolaminates, forming a magnetic layer on the STO stack, and forming a Perpendicular Magnetic Anisotropy (PMA) promoting layer on the magnetic layer, the PMA promoting layer being configured to promote PMA in the magnetic layer.

The magnetic structure, which is fabricated by the method of the first aspect, allows obtaining a significantly stronger VCMA effect (e.g., if a voltage is applied to the bottom electrode layer) than so far, in particular at room temperature. This is at least in part due to the specific fabrication technique of the STO stack, i.e., forming the two different STO nanolaminates by the ALD. In particular, a high permittivity of the STO stack is achieved in this way, which leads to the stronger VCMA effect, for instance, in the magnetic device. The VCMA effect may even be sufficiently strong to suppress altogether the PMA in the magnetic layer. The magnetic structure is suitable for building an MTJ stack in the magnetic device. Overall, the method of the first aspect is able to produce a magnetic structure suitable for fabricating an ultralow-power magnetic memory or logic device.

In an implementation form of the method according to the first aspect, the magnetic layer comprises a Co layer and/or the PMA promoting layer comprises a Pt layer or a MgO layer.

For instance, a Co/Pt layer combination (bilayer), or a ferromagnet/MgO bilayer—e.g. a Co/MgO bilayer, or a Fe/MgO bilayer, or a Ni/MgO bilayer, or a bilayer of a Co/Fe/Ni alloy and MgO—can optimize the PMA. The ferromagnet in the ferromagnet/MgO bilayer may also have a boron content. Further, the STO/Co interface may promote the PMA and also the VCMA effect. Further, the MgO layer may conveniently be used as a tunnel barrier in the magnetic device, particularly in an MTJ stack of the magnetic device.

In an implementation form of the method according to the first aspect, the STO stack comprises a first Sr-rich STO nanolaminate and a second Ti-rich STO nanolaminate.

This sequence of Sr-rich $SrTiO3$ and Ti-rich $SrTiO3$ in the STO stack leads to a significant enhancement of the permittivity of the STO stack, and thus can lead to a stronger VCMA effect.

In an implementation form of the method according to the first aspect, the first Sr-rich STO nanolaminate comprises a (Sr-rich $STO/TiO_2$)xn nanolaminate, wherein n is in a range of 1-5, and preferably n is 3.

In an implementation form of the method according to the first aspect, the second Ti-rich STO nanolaminate comprises Sr in a range of 35-45%, preferably of 40%.

The above implementation forms provide a specific sequence of Sr-rich $SrTiO3$ and Ti-rich $SrTiO3$, which can optimize the permittivity of the STO stack.

In an implementation form of the method according to the first aspect, the bottom electrode layer comprises a tensile TiN layer.

Providing the TiN layer may lead to a tensile strain situation, which strongly enhances the permittivity of the STO stack and thus the VCMA effect.

According to a second aspect, the disclosure relates to a magnetic device, comprising: a bottom electrode layer, a $SrTiO_3$, STO, stack provided on the bottom electrode layer, a magnetic layer provided on the STO stack, the magnetic layer comprising a free magnetic layer, a tunnel barrier provided on the magnetic layer, the tunnel barrier being configured to promote a PMA in the free magnetic layer, a magnetic reference layer provided on the tunnel barrier, and a top electrode layer provided on or above the tunnel barrier.

The magnetic device of the second aspect enjoys the above-described advantages and effects of the magnetic stack of the first aspect, in particular, the high permittivity of the STO stack. The magnetic structure may be used to form a MTJ stack in the magnetic device. By using the magnetic structure, a stronger VCMA effect may be achieved in the magnetic device, and thus a current for magnetization switching may be reduced. The magnetic device may accordingly operate more energy-efficiently.

In an implementation form of the magnetic device according to the second aspect, the magnetic device further comprises a field bias layer provided on the magnetic reference layer, and a top electrode layer provided on the field bias layer or a top electrode layer provided on the magnetic reference layer, and a field bias layer embedded into the top electrode layer.

The field bias layer may tilt a magnetization in the free magnetic layer, thus enabling efficient processional switching of the magnetization by means of the VCMA effect.

In an implementation form of the magnetic device according to the second aspect, the magnetic device further comprises at least one first pillar structured based on one of the following: the magnetic reference layer, the field bias layer, and the top electrode layer; the tunnel barrier, the magnetic reference layer, the field bias layer, and the top electrode layer.

In an implementation form of the magnetic device according to the second aspect, the magnetic device further comprises at least one second pillar, structured from a further electrode layer provided on the tunnel barrier or on the magnetic layer.

The above implementation forms provide specific magnetic device designs, which can employ the strong VCMA effect.

In an implementation form of the magnetic device according to the second aspect, the magnetic device is a three- or two-terminal VCMA device or is a three-terminal STT device.

In an implementation form of the magnetic device according to the second aspect, the magnetic device is a three-terminal device, and a first terminal is connected to the top electrode layer of a first pillar, a second terminal is connected to the top electrode layer of another first pillar, and a third terminal is connected to the bottom electrode layer; or a first terminal is connected to the top electrode layer of a first pillar, a second terminal is connected to the further electrode layer of a second pillar, and a third terminal is connected to the bottom electrode layer; or a first terminal is connected to the top electrode layer, a second terminal is connected to the magnetic layer, and a third terminal is connected to the bottom electrode layer.

The above implementation form provides a specific magnetic device design, which can employ the strong VCMA effect.

According to a third aspect, the disclosure relates to a magnetic structure for a magnetic device, wherein the magnetic structure comprises: a bottom electrode layer, a $SrTiO_3$, STO, stack comprising at least two different STO nanolaminates, wherein the STO stack is provided on the bottom electrode layer, a magnetic layer provided on the STO stack; and a PMA promoting layer provided on the magnetic layer and configured to promote a PMA in the magnetic layer.

The magnetic structure of the third aspect provides the effects and advantages described above. In particular, it may lead to a stronger VCMA effect, due to using the high-permittivity STO stack, e.g. when a voltage is applied to the bottom electrode layer. The VCMA effect can especially be strong at room temperature. The VCMA effect may even be sufficiently strong to remove the PMA (induced) in the magnetic layer altogether.

In an implementation form of the magnetic structure according to the third aspect, the permittivity of the STO stack is larger than 100, in particular is about 120, at room temperature.

In an implementation form of the magnetic structure according to the third aspect, a grain size of the STO of the STO stack is below 50 nm.

BRIEF DESCRIPTION OF THE DRAWINGS

The above described aspects of the disclosure and implementation forms of the present invention will be explained in the following description of specific embodiments in relation to the enclosed drawings, in which.

DETAILED DESCRIPTION OF CERTAIN
ILLUSTRATIVE EMBODIMENTS

Some MTJ stack-based magnetic devices, e.g., magnetoresistive random access memory (MRAM) devices or spin transfer torque (STT) MRAM devices, use considerable amounts of current to switch the magnetization of the magnetic free layer. Thus, such MTJ stack based magnetic devices may not be sufficiently energy-efficient for some applications.

Making use of a voltage to assist the switching of the magnetization may lower the required current. Indeed, some examples of magnetic devices use voltage-assisted switching in MTJ stacks. Those examples include, for instance, voltage control of magnetic anisotropy (VCMA) in strain-coupled ferromagnetic (FM) metal/ferroelectric bilayers, and voltage control of the exchange field in FM metal/multiferroic bilayers.

Further, most magnetic memory and logic devices employ magnetic anisotropy determining a preferential orientation of the magnetic moment. Decreasing or removing this magnetic anisotropy can be a tool to manipulate the magnetic state in such magnetic devices. In VCMA, for instance, an electric field may be used to modulate the magnetic anisotropy. However, the VCMA effect has been limited to be efficiently employed in magnetic devices based on MTJ stack. Consequently, VCMA-based magnetic devices are not yet feasible.

The disclosure relates to magnetic memory and logic devices that address these challenges associated with magnetic memory and logic devices. In particular, the disclosed technology relates to employing the VCMA effect for magnetization switching. To this end, embodiments provide a method for manufacturing a magnetic structure for a magnetic device, provide the magnetic device, and provide the magnetic structure.

Figure 1:
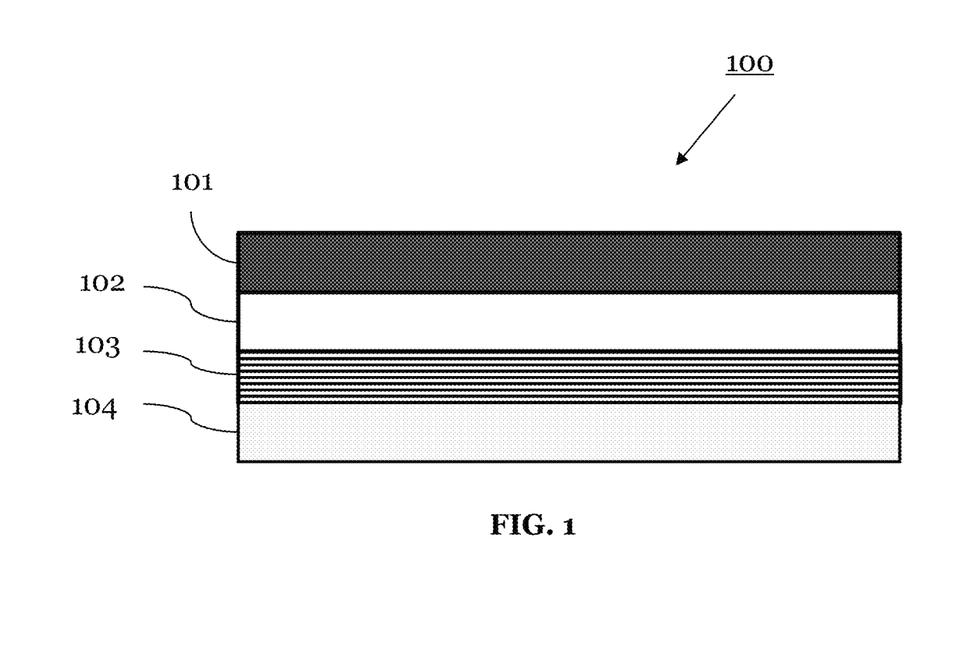
FIG. 1 shows a schematic representation of a cross-sectional view of a magnetic structure for a magnetic device, according to an embodiment.

FIG. 1 shows a magnetic structure 100 according to an embodiment, wherein the magnetic structure 100 is suitable for a magnetic device 200 according to an embodiment. In particular, the magnetic structure 100 can be used to form a MTJ stack in a magnetic memory or logic device 200 (FIGS. 2-6).

The magnetic structure 100 comprises a bottom electrode layer 104 (e.g., comprising a tensile TiN layer), a strontium titanate (STO) stack 103 provided on the bottom electrode layer 104, a magnetic layer 102 (e.g., comprising a Co layer) provided on the STO stack 103, and a perpendicular magnetic anisotropy (PMA)-promoting layer 101 (e.g., comprising a Pt layer or a MgO layer) provided on the magnetic layer 102. The PMA promoting layer 101 may promote/strengthen/enhance a PMA in the magnetic layer 102. That is, the PMA promoting layer may not be solely responsible for the PMA in the magnetic layer. However, the PMA promoting layer 101 could also be a PMA inducing layer, which is configured to induce the PMA in the magnetic layer 102. As described herein, while an STO stack may be referred to as a $SrTiO_3$ stack, it will be understood that portions of the STO stack may deviate from the stoichiometric $SrTiO_3$. For example, an STO stack may include a Sr-rich STO portion having a higher amount of Sr relative to Ti, and a Ti-rich STO portion having a higher amount of Ti relative to Sr. The overall STO stack 103 may be stoichiometric.

According to embodiments, the STO stack 103 comprises at least two different STO nanolaminates having different stoichiometries. A (STO) nanolaminate may thereby comprise a set of (STO) layers, e.g., nanolayers formed by atomic layer deposition (ALD). A set of STO layers may comprise one or more layers. The two different STO nanolaminates comprise a first Sr-rich STO nanolaminate and a second Ti-rich STO nanolaminate. The first STO nanolaminate may, accordingly, comprises a first set of Sr-rich layers. The second STO nanolaminate may, accordingly, comprise a second set of Ti-rich layers.

The permittivity (k) of the STO stack 103 may be larger than k=100, in particular the permittivity may be k=100-120, or even k≥120, specifically at room temperature. Further, the STO stack 103 may be polycrystalline and a grain size of the STO crystals, e.g., on average, of the STO stack 103 may be below 50 nm, or even below 25 nm. The STO stack 103 supports an enhanced VCMA effect in the magnetic structure 100 (e.g., enhanced compared to a conventional high-k stack), in particular in a magnetic device 200 employing the magnetic structure 100.

The strong VCMA effect may be obtained by an exemplary magnetic structure 100 comprising a TiN\STO\Co\Pt layer sequence, according to the layer examples described above. The TiN layer 104 and the STO dielectric layer 103 may be deposited such that the permittivity of the dielectric STO stack 103 is optimized and reaches k≥120. The Co\Pt layer combination (bilayer) can be designed to strengthen/optimize the PMA, and the STO\Co interface may be oxidized to promote the PMA and the VCMA effect. The Pt layer 101 may be chosen specifically for the Co layer 102, because it enhances the PMA of Co significantly. However, other possibilities are available. For example, an MgO layer 101 deposited on the Co layer 102 can also promote a strong PMA. These two examples are, therefore, interchangeable in the present disclosure, as the PMA promoting layer 101.

The stoichiometric STO stack 103 may be obtained by combining the first STO nanolaminate, specifically (Sr-rich $STO/TiO_2$)xn, wherein n is an integer number in the range of n=1-5, preferably n=3, and a second STO nanolaminate (Ti-rich STO). The Sr content in the second STO nanolaminate may be in the range of 35-45%, with a preferred value being 40%, and it may be deposited after an optional thermal treatment was applied to the first STO nanolaminate. An optional second thermal treatment may lead to an intermixing of the two STO nanolaminates, with the formation of the STO layer 103 comprising STO with a controlled grain size below 50 nm, a dielectric constant of k=100-120, and a low leakage current density in the order of $10^{-7}$ $A/cm^2$.

The TiN layer 104 may act as a template during the crystallization of the STO, thus enabling a good quality interface between the metal and the dielectric STO. The combination of the TiN layer 104, the ALD process producing the two or more nanolaminates, and the Co magnetic layer 102, may lead to a tensile strain situation for the TiN layer 104, which strongly enhances the permittivity and, as such, the VCMA effect.

Figure 7:
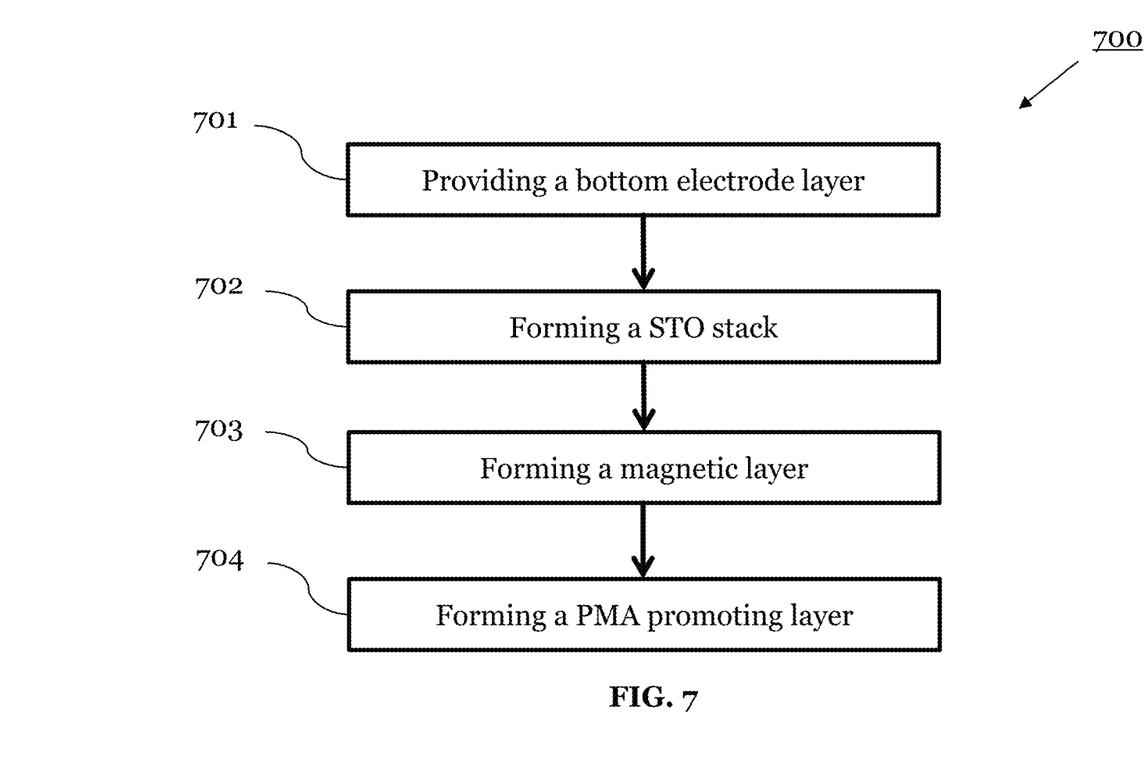
FIG. 7 shows a schematic representation of a method of manufacturing a magnetic structure for a magnetic device, according to an embodiment.

FIG. 7 shows a schematic representation of a method 700 for manufacturing the magnetic structure 100 of FIG. 1. The method 700 comprises the following steps:

Providing 701 the bottom electrode layer 104.
Forming 702 the STO stack 103 on the bottom electrode layer 104 by ALD of the at least two different STO nanolaminates. That is, each nanolaminate may be deposited by ALD, e.g., one nanolaminate after the other.
Forming 703 the magnetic layer 102 on the STO stack 103.
Forming 704 the PMA promoting layer 101 on the magnetic layer 102, wherein the PMA promoting layer 101 is configured to promote PMA in the magnetic layer 102.

Notably, in this disclosure, forming a layer "on" another layer may mean growing/depositing these layers one upon the other. Thus, surfaces of these layers can be in contact. Forming a layer "above" another layer may mean that this layer is formed after the other layer, but there may be one or more layers formed therebetween.

FIG. 2-FIG. 6 show exemplary designs for magnetic devices 200, which are based on the magnetic structure 100 of FIG. 1, and employ the strong VCMA effect enabled by the magnetic structure 100. In particular, the magnetic devices 200 are MTJ based magnetic devices 200.

In each of FIG. 2-FIG. 6, a white arrow placed into a layer represents a magnetization of that layer. The orientation of the magnetization may correspond to the orientation of the arrow. The thinner white arrows represent the magnetization of the magnetic layer 102, e.g., the layer where the magnetization can switch. The thicker white arrows represent fixed/pinned magnetization.

Further, in each of FIG. 2-FIG. 6, dashed black arrows represent stray magnetic field outside of the magnetic device 200. The stray field may, for example, originate from the field bias layer 202, and may tilt the magnetization of the magnetic layer 102. The stray field supports controllable precessional switching.

Figure 2:
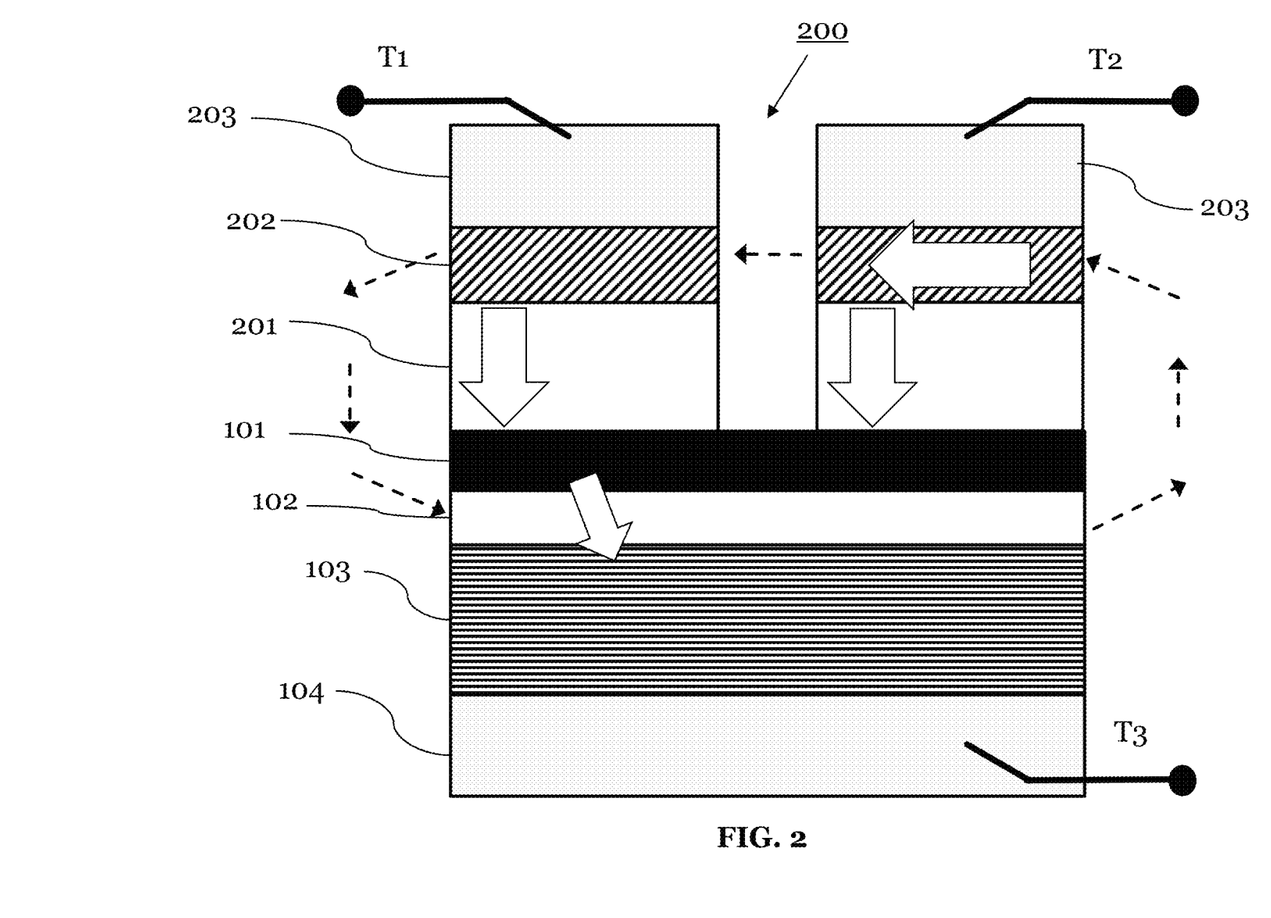
FIG. 2 shows a schematic representation of a cross-sectional view of a three-terminal magnetic device, according to an embodiment.

FIG. 2 shows a schematic representation of an exemplary three-terminal magnetic device 200 according to an embodiment. The magnetic device 200 employs/includes the magnetic structure 100 shown in FIG. 1. Same elements in FIG. 1 and FIG. 2 are labelled with the same reference signs. The magnetic device 200 shown in FIG. 2 accordingly comprises the bottom electrode layer 104, the STO stack 103 provided on the bottom electrode layer 104, the magnetic layer 102 provided on the STO stack 103, and the PMA-promoting layer 101 on the magnetic layer 102.

Specifically, in the magnetic device of FIG. 2, the magnetic layer 102 comprises or functions as a free magnetic layer (e.g., comprising Co). Further, the PMA promoting layer 101 functions as a tunnel barrier 101 (e.g., comprising an MgO layer). That is, in the magnetic device 200, the tunnel barrier 101 promotes PMA in the free magnetic layer 102. Further, a magnetic reference layer 201 is provided on the tunnel barrier 101, thus forming an MTJ stack together with the magnetic layer 102 and the tunnel barrier 101. In addition, a top electrode layer 203 is provided above the tunnel barrier 101. A field bias layer 202 is provided between the magnetic reference layer 201 and the top electrode layer 203.

The magnetic device 200 is, in this exemplary embodiment, a three-terminal VCMA device having first to third terminals T1, T2, T3. The magnetic device 200 comprises two or more pillars (two are illustrated), wherein both pillars are structured based on (e.g., patterned and/or etched using) the magnetic reference layer 201, the field bias layer 202, and the top electrode layer 203, respectively. That is, these layers 201, 202, and 203, are patterned such that they form two separate pillars. Each pillar consequently comprises a part of each of these layers 201, 202, and 203. Further, the first terminal T1 is connected to the top electrode layer 203 of one of the pillars (left side pillar in FIG. 2), and the second terminal T2 is connected to the top electrode layer 203 of the other one of the pillars (right side pillar in FIG. 2). The third terminal T3 is connected to the bottom electrode layer 104.

Figure 3:
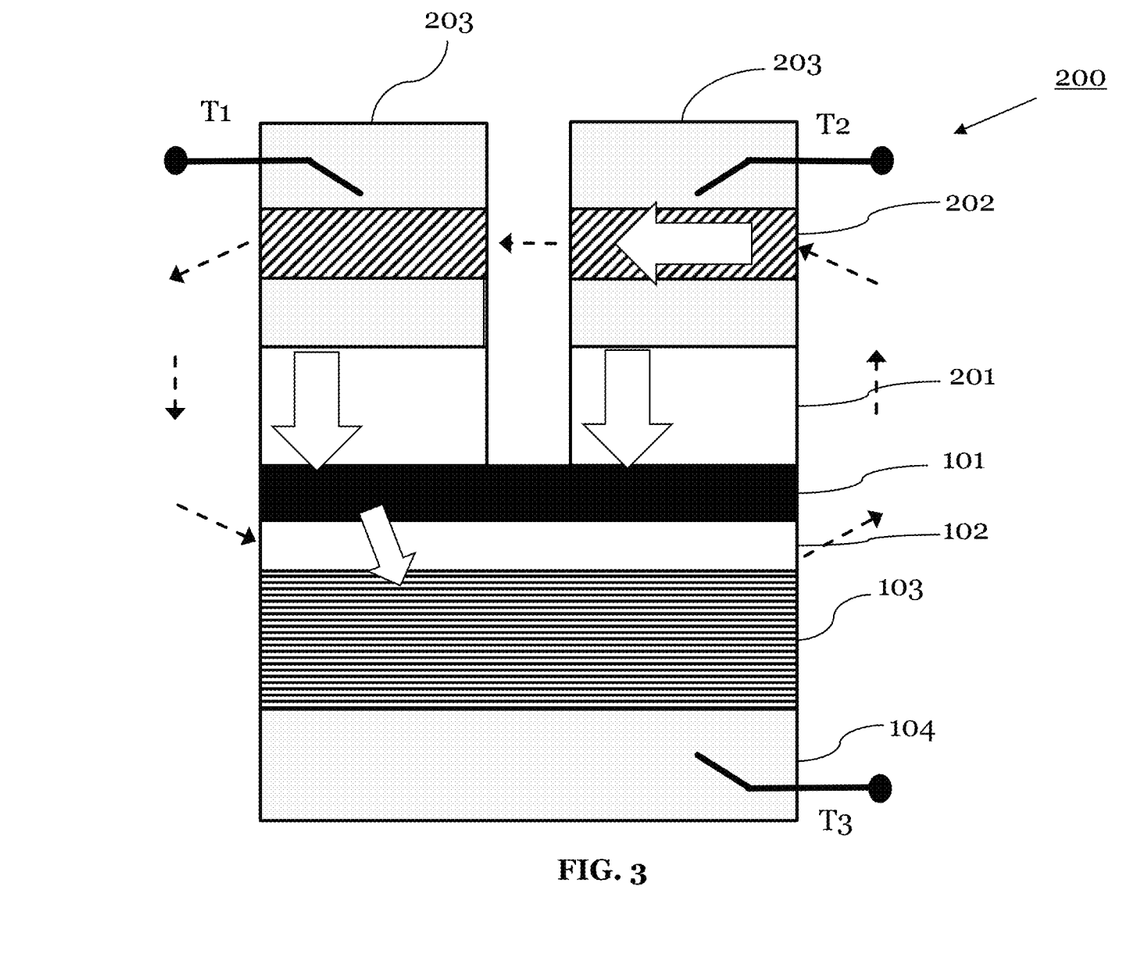
FIG. 3 shows a schematic representation of a cross-sectional view of a three-terminal magnetic device, according to an embodiment.

FIG. 3 shows a schematic representation of an exemplary three-terminal magnetic device 200 according to another embodiment, which is similar to the embodiment of FIG. 2 in some respects. The magnetic device 200 of FIG. 3 employs/includes the magnetic structure 100 shown in FIG. 1. Same elements in FIG. 2 and FIG. 3 are labelled with the same reference signs, may be implemented likewise, and may function likewise.

In particular, as shown in FIG. 3, compared to the magnetic device 200 of FIG. 2, the field bias layer 202 is positioned higher up in the stack. In particular, in this exemplary embodiment, the top electrode layer 203 is provided on the magnetic reference layer 201, and the field bias layer 202 is embedded into the top electrode layer 203. The first terminal T1 is again connected to the top electrode layer 203 of one of the pillars (left side pillar in FIG. 3), and the second terminal T2 is again connected to the top electrode layer 203 of the other one of the pillars (right side pillar in FIG. 3). The third terminal T3 is connected to the bottom electrode layer 104.

Figure 4:
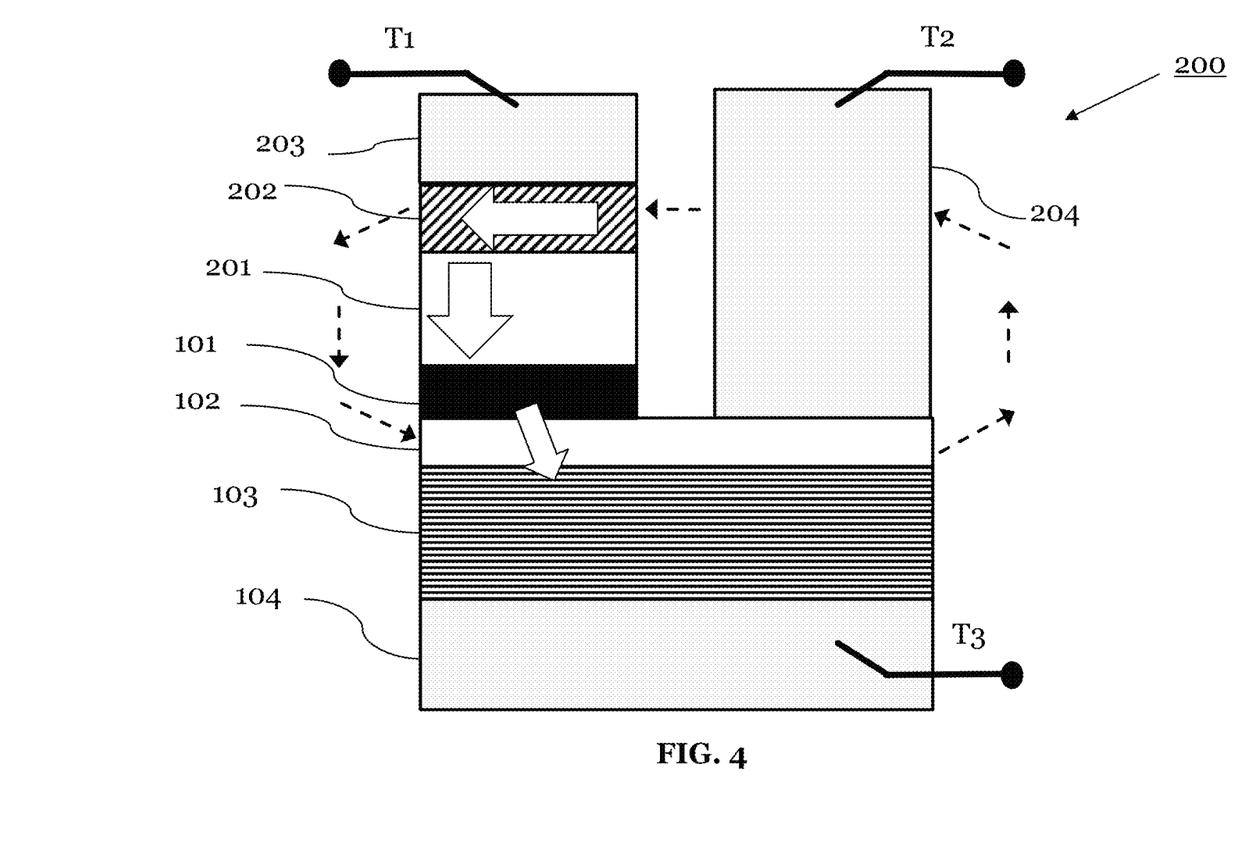
FIG. 4 shows a schematic representation of a cross-sectional view of a three-terminal magnetic device, according to an embodiment.

FIG. 4 shows a schematic representation of an exemplary three-terminal magnetic device 200 according to another embodiment, which is similar to the embodiments shown in FIG. 2 and FIG. 3, respectively, in some respects. The magnetic device 200 of FIG. 4 employs/includes the magnetic structure 100 shown in FIG. 1. Same elements in FIG. 2 or FIG. 3 and in FIG. 4 are labelled with the same reference signs, may be implemented likewise, and may function likewise.

In this embodiment of FIG. 4, the magnetic device 200 comprises a first pillar (left side pillar in FIG. 4), which is structured based on the tunnel barrier 101, the magnetic reference layer 201, the field bias layer 202, and the top electrode layer 203, respectively. That is, compared to FIG. 2, also the tunnel barrier 101 is patterned. Further, the magnetic device 200 comprises a second pillar (right side pillar in FIG. 4), which is structured from a further electrode layer 204 provided on the magnetic layer 102. That is, this pillar is different than the right-side pillar of FIG. 2. Otherwise the magnetic devices 200 are similar.

In the magnetic device 200 of FIG. 4, the first terminal T1 is connected to the top electrode layer 203 of the first pillar, the second terminal T2 is connected to the further electrode layer 204 of the second pillar, and the third terminal T3 is connected to the bottom electrode layer 104. The second terminal T2 is accordingly arranged in direct contact with the magnetic layer 102 (that functions as the free magnetic layer), so that the resistance of the MTJ stack and, therefore, the readout energy consumption, can be decreased.

The magnetic devices 200 shown in FIG. 2, FIG. 3 and FIG. 4, respectively, are VCMA devices 200. In these magnetic devices 200, a precessional switching of the magnetization of the free magnetic layer 102 may be achieved by employing the VCMA effect to suppress the PMA, which is induced/present in the free magnetic layer 102 by means of the tunnel barrier 101. In particular, the magnetization of the magnetic layer 102 is tilted by the field bias layer 202 (stray field, see above). This enables efficient precessional switching of the magnetization of the magnetic layer 102, by applying a giant voltage (VCMA) pulse to the third terminal T3 that removes the PMA. The magnetization of the magnetic layer 102 may be switched by controlling, for instance, the pulse duration of the voltage pulse applied to the third terminal T3.

Further, the state of the magnetization of the magnetic layer 102 can be read out by applying a TMR (current) pulse between the first terminal T1 and the second terminal T2. In this case, a TMR current flows from the first terminal T1 to the second terminal T2. The current differs depending on the magnetization state of the magnetic layer 102, due to corresponding low-resistance or high-resistance (TMR) states.

In order to make the magnetic devices 200 function better than conventional MTJ based devices, a strong VCMA effect is employed. Here, in the magnetic devices 200, the STO stack 103 and the magnetic layer 102 provided on the STO stack 103, enable a giant VCMA effect, which is sufficiently strong to improve the magnetic devices 200 over conventional MTJ based devices.

The strong VCMA effect (already at room temperature) even allows removing completely the anisotropy energy barrier between the two magnetization states of the magnetic layer 102, when applying the large voltage pulse to the third terminal T3. This enables the efficient precessional switching (by controlling, e.g., the duration of the voltage pulse) of the magnetization of the magnetic layer 102. Thus, a magnetization switching current is drastically reduced compared to a conventional MTJ stack based device. Further, since the VCMA effect is strong in the magnetic device 200, the anisotropy energy barrier can be designed generally larger, which leads to an increased data retention in the magnetic device 200.

A top-pinned MTJ stack is preferred for use in the magnetic device 200 according to an embodiment. This is because the magnetic layer 102, tunnel barrier 101 and magnetic reference layer 201 (MTJ stack) can then be deposited on top of the high-k dielectric STO stack 103 (i.e., can be formed after the STO stack 103). The ALD grown STO stack 103 reaches its highest permittivity after a high temperature anneal, in this case, e.g., at 650° C. The MTJ stack could deteriorate above a thermal budget of, e.g., 400° C. and, therefore, is preferably not exposed to the crystallization anneal of the STO stack 103. Thus, the STO stack 103 is preferably formed before the MTJ stack. In addition, the STO crystallinity is promoted by the bottom electrode layer 104. The magnetic layer 102, which is deposited on top of the STO stack 103, contributes, but to a lesser extent.

Figure 5:
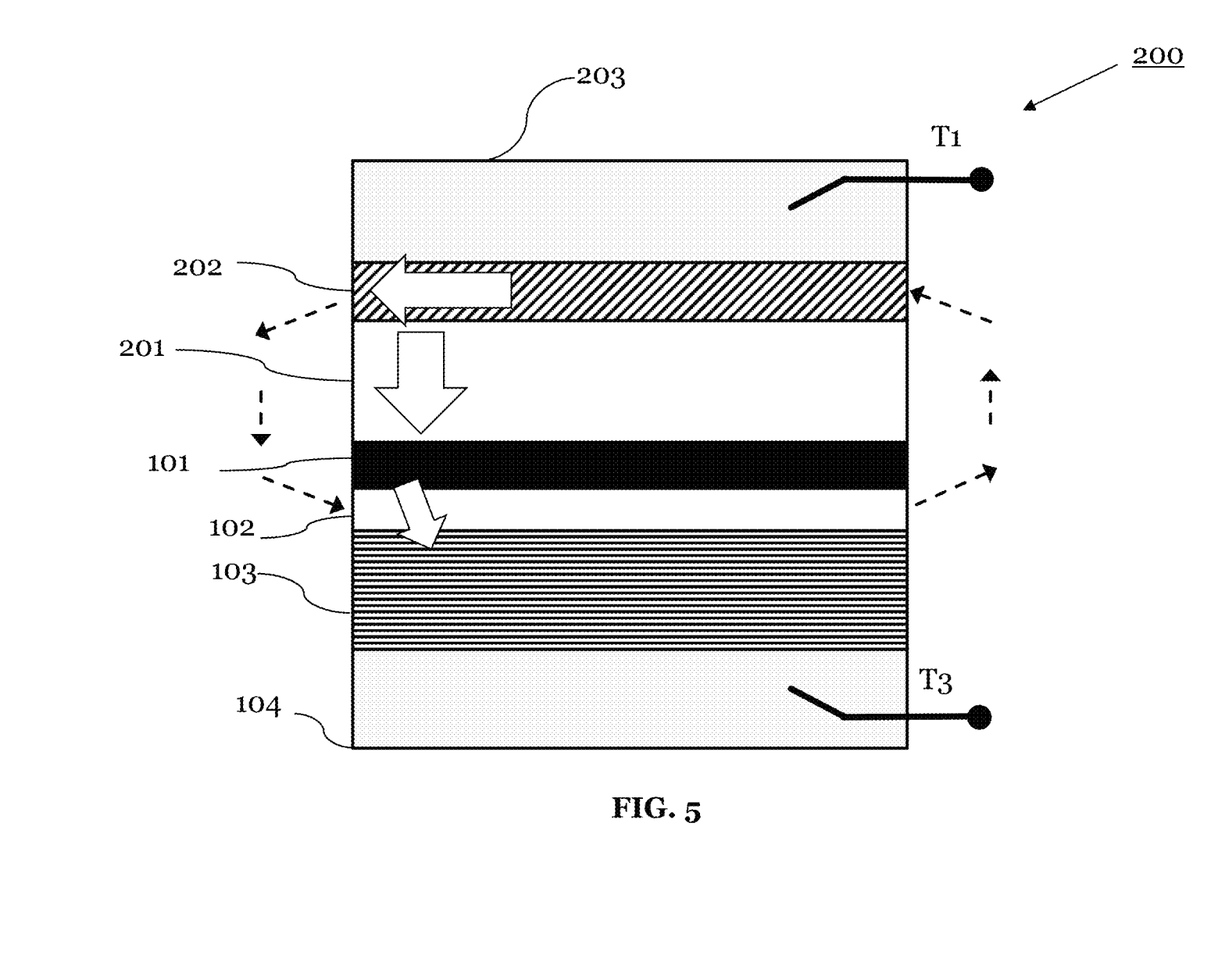
FIG. 5 shows a schematic representation of a cross-sectional view of a two-terminal magnetic device, according to an embodiment.

FIG. 5 shows a schematic representation of an exemplary two-terminal magnetic device 200 according to an embodiment. In particular, in this exemplary embodiment, the magnetic device 200 is a VCMA device. The magnetic device 200 of FIG. 5 employs/includes the magnetic structure 100 shown in FIG. 1. Same elements in FIG. 2, FIG. 3 or FIG. 4, and in FIG. 5, are labelled with the same reference signs, may be implemented likewise, and may function likewise.

The magnetic device 200 of FIG. 5 comprises the bottom electrode layer 104, the STO stack 103 on the bottom electrode layer 104, the magnetic (free) layer 102 on the STO stack 102, the (PMA promoting) tunnel barrier 101 on the magnetic layer 102, the magnetic reference layer 201 (could be a synthetic antiferromagnet) on the tunnel barrier 101, the field bias layer 202 on the magnetic reference layer 201, and the top electrode layer 203 on the field bias layer 202.

The first terminal T1 is connected to the top electrode layer 203. There is no second terminal T2. The third terminal T3 is connected to the bottom electrode layer 104. In this magnetic device 200, a precessional switching of the magnetization of the magnetic layer can be achieved through the VCMA effect, when a voltage pulse is applied to the third terminal T3. The tunnel barrier 101 (e.g., comprising MgO) and the high-k properties of the STO stack 103 are preferably tuned carefully, such that the MgO and high-k bands lead to two different resistance states.

Figure 6:
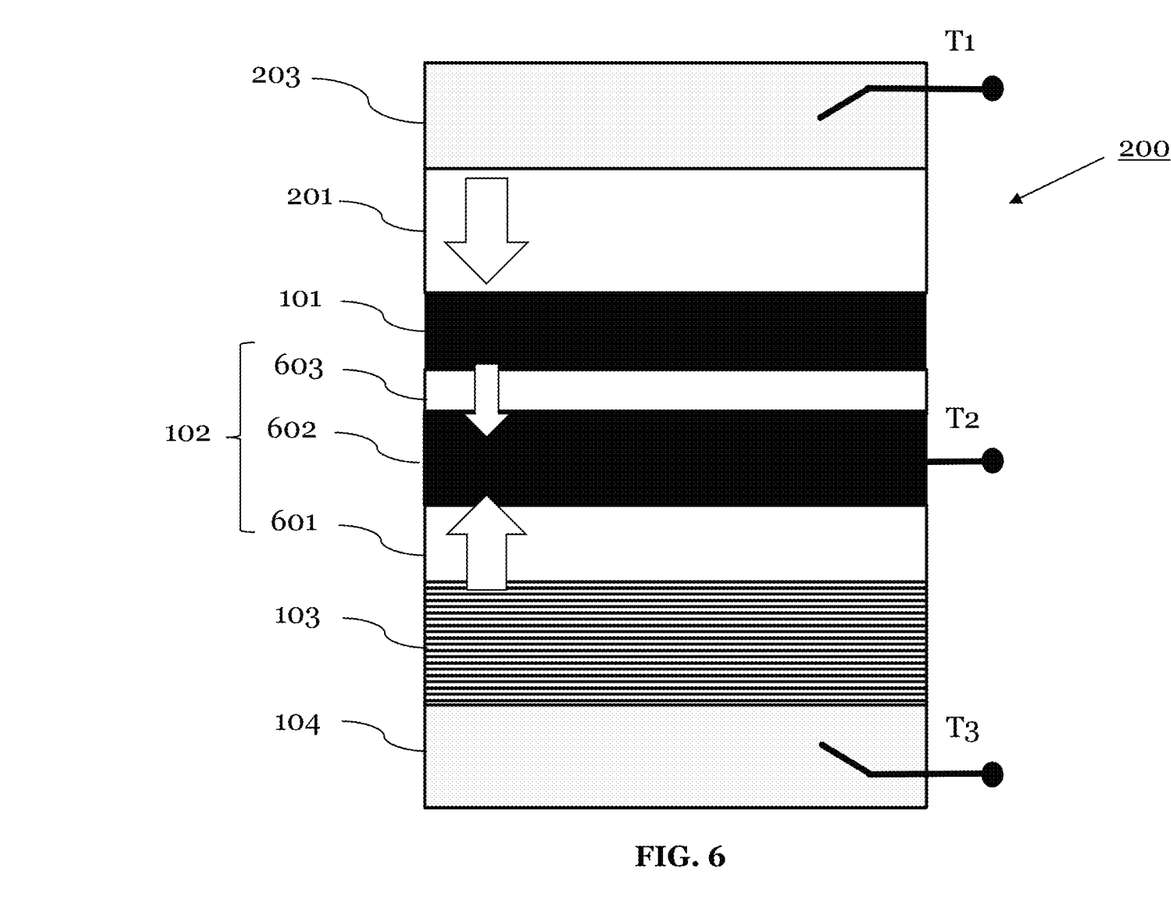
FIG. 6 shows a schematic representation of a cross-sectional view of a three-terminal magnetic device, according to an embodiment.

FIG. 6 shows a schematic representation of an exemplary magnetic device 200 according to an embodiment. In particular, in this embodiment, the magnetic device 200 is a three-terminal STT device. The magnetic device 200 of FIG. 6 employs/includes the magnetic structure 100 shown in FIG. 1. Same elements in FIG. 2, FIG. 3, FIG. 4 or FIG. 5, and in FIG. 6, are labelled with the same reference signs, may be implemented likewise, and may function likewise.

The magnetic device 200 comprises the bottom electrode layer 104, the STO stack 103 on the bottom electrode layer 104, and the magnetic layer 102 on the STO stack 103. Here the magnetic layer 102 comprises an antiferromagnetic (AFM) bias layer 601 on the STO stack 103, an AFM coupling layer 602 on the AFM bias layer 601, and a magnetic free layer 603 on AFM coupling layer 602. Further, the magnetic device 200 comprises the (PMA promoting) tunnel barrier 101 on the magnetic layer 102, the magnetic reference layer 201 (could be a synthetic antiferromagnet) on the tunnel barrier 101, and the top electrode layer 203 on the magnetic reference layer 201.

In this embodiment, the first terminal T1 is connected to the top electrode layer 203, the second terminal T2 is connected to the magnetic layer 102, and the third terminal T3 is connected to the bottom electrode layer 104. A voltage pulse to the third terminal T3 may remove the anisotropy from the high-anisotropy antiferromagnetic (AFM) bilayer of the magnetic layer 102 (i.e., the bilayer of the AFM bias layer 601 and AFM coupling layer 602). The low anisotropy magnetic free layer 603 of the magnetic layer 102 can be tilted, and can be switched with a small STT current through the tunnel barrier (current pulse flowing from first terminal T1 to second terminal T2 through the tunnel barrier 101).

The present disclosure has been described in conjunction with various embodiments as examples as well as implementations of the invention. However, other variations can be understood and effected by those persons skilled in the art and practicing the claimed invention, from the studies of the drawings, this disclosure and the independent claims. In the claims as well as in the description the word "comprising" does not exclude other elements or steps and the indefinite article "a" or "an" does not exclude a plurality. A single element or other unit may fulfill the functions of several entities or items recited in the claims. The mere fact that certain measures are recited in the mutual different dependent claims does not indicate that a combination of these measures cannot be used in an advantageous implementation.

What is claimed is:

1. A magnetic device, comprising:
a bottom electrode layer;
a strontium titanate (STO) stack on the bottom electrode layer;
a magnetic layer on the STO stack, the magnetic layer having a perpendicular magnetic anisotropy and comprising a free magnetic layer;
a tunnel barrier on the magnetic layer;
a magnetic reference layer on the tunnel barrier;
a top electrode layer on or over the tunnel barrier;
a field bias layer, that is disposed between the magnetic reference layer and the top electrode layer, or is embedded into the top electrode layer that is formed on the magnetic reference layer; and
at least one first pillar each comprising the magnetic reference layer, the field bias layer and the top electrode layer.

2. A method of manufacturing the magnetic device of claim 1, the method comprising:
providing the bottom electrode layer;
forming the STO stack on the bottom electrode layer by atomic layer deposition (ALD) of at least two different STO nanolaminates;
forming the magnetic layer on the STO stack, the magnetic layer comprising the free magnetic layer;
forming the tunnel barrier on the magnetic layer;
forming the magnetic reference layer on the tunnel barrier;
forming the top electrode layer on or over the tunnel barrier;
forming a field bias layer, that is disposed between the magnetic reference layer and the top electrode layer, or is embedded into the top electrode layer that is formed on the magnetic reference layer; and
forming at least one first pillar each comprising the magnetic reference layer, the field bias layer and the top electrode layer.

3. The method of claim 2, wherein the STO stack comprises a Sr-rich STO nanolaminate and a Ti-rich STO nanolaminate.

4. The method of claim 3, wherein the Sr-rich STO nanolaminate comprises a (Sr-rich STO/TiO$_2$)$_n$ nanolaminate, wherein n is 1-5.

5. The method of claim 3, wherein the Ti-rich STO nanolaminate comprises Sr in a range of 35-45%.

6. The method of claim 2, wherein the bottom electrode layer comprises a tensile TiN layer.

7. The method of claim 2, wherein the magnetic layer comprises Co, Ni, Fe or an alloy thereof, and wherein the tunnel barrier comprises a MgO layer.

8. The magnetic device of claim 1, wherein the each of the at least one first pillar further comprises the tunnel barrier.

9. The magnetic device of claim 1, further comprising at least one second pillar each comprising a further electrode layer on the tunnel barrier or on the magnetic layer.

10. The magnetic device of claim 1, wherein the magnetic device is a three-terminal or two-terminal voltage control of magnetic anisotropy (VCMA) device or is a three-terminal spin-transfer torque (STT) device.

11. The magnetic device of claim 1, wherein the magnetic device is a three-terminal device comprising:
- a first terminal connected to the top electrode layer of a first pillar, a second terminal connected to the top electrode layer of another first pillar, and a third terminal connected to the bottom electrode layer; or
- a first terminal connected to the top electrode layer of a first pillar, a second terminal connected to the further electrode layer of a second pillar, and a third terminal connected to the bottom electrode layer; or
- a first terminal connected to the top electrode layer, a second terminal connected to the magnetic layer; and a third terminal connected to the bottom electrode layer.

12. A magnetic structure for a magnetic device, the magnetic structure comprising:
- a bottom electrode layer;
- a strontium titanate (STO) stack on the bottom electrode layer and comprising at least two different STO nanolaminates;
- a magnetic layer provided on the STO stack and having a perpendicular magnetic anisotropy; and
- a Pt layer or a MgO layer on the magnetic layer.

13. The magnetic structure of claim 12, wherein the STO stack has a permittivity greater than 100 at room temperature.

14. The magnetic structure of claim 12, wherein a grain size of the STO of the STO stack is less than 50 nm.

15. The magnetic device of claim 1, wherein the tunnel barrier comprises a MgO layer.

16. The magnetic device of claim 15, wherein the magnetic device comprises a ferromagnet/MgO bilayer on the magnetic layer, wherein the ferromagnet/MgO bilayer comprises the MgO layer.

17. The magnetic device of claim 16, wherein the ferromagnet/MgO bilayer is selected from the group consisting of a Co/MgO bilayer, a Fe/MgO bilayer, a Ni/MgO bilayer, or a bilayer of a Co/Fe/Ni alloy and the MgO layer.

18. The magnetic structure of claim 12, wherein the magnetic structure comprises a bilayer on the magnetic layer, wherein the bilayer is a Co/Pt bilayer comprising the Pt layer or a ferromagnet/MgO bilayer comprising the MgO layer.

* * * * *